United States Patent [19]

Byers

[11] Patent Number: 4,716,443
[45] Date of Patent: Dec. 29, 1987

[54] PHOTOGRAPHIC IMAGE PRECISION REPROPORTIONING SYSTEM

[76] Inventor: Thomas L. Byers, P.O. Box 26624, Oklahoma City, Okla. 73126

[21] Appl. No.: 896,556

[22] Filed: Aug. 14, 1986

Related U.S. Application Data

[63] Continuation-in-part of Ser. No. 676,336, Nov. 29, 1984, Pat. No. 4,607,952.

[51] Int. Cl.⁴ .................. G03B 27/10; G03B 27/68
[52] U.S. Cl. .................................. 355/84; 355/52
[58] Field of Search ................. 355/40, 78, 84, 52

[56] References Cited

U.S. PATENT DOCUMENTS

| | | | |
|---|---|---|---|
| 3,126,809 | 3/1964 | Adams et al. | 355/78 |
| 3,445,165 | 5/1969 | Dubbs | 355/84 |
| 3,767,301 | 10/1973 | Solo | 355/52 |
| 3,992,094 | 11/1976 | Adcock | 355/52 X |
| 4,268,166 | 5/1981 | Byers | 355/52 X |
| 4,350,437 | 9/1982 | Fishburn | 355/52 |
| 4,390,272 | 6/1983 | Anderson | 355/52 X |
| 4,396,280 | 8/1983 | Parsons | 355/52 |
| 4,475,809 | 10/1984 | Byers | 355/52 X |
| 4,545,673 | 10/1985 | Bergsma | 355/52 |

*Primary Examiner*—L. T. Hix
*Assistant Examiner*—D. Rutledge
*Attorney, Agent, or Firm*—Robert K. Rhea

[57] ABSTRACT

A photographic reproportioning apparatus for changing one dimension or edge configuration of a two dimension image contact print exposed on a photosensitive film moved by a support platen in a predetermined linear direction with respect to the image being reproduced by a reversible synchronous motor. A stationary overlying film carriage supports the original film image in contact with the photosensitive film. An opaque mask overlies the film support members and includes a motor moving an aperture bar assembly in a selected direction relative to the sensitive film. A light passing slit, in the aperture bar assembly, transversely of the direction of its movement, exposes the film from an overhead light source during movement of the mask.

12 Claims, 22 Drawing Figures

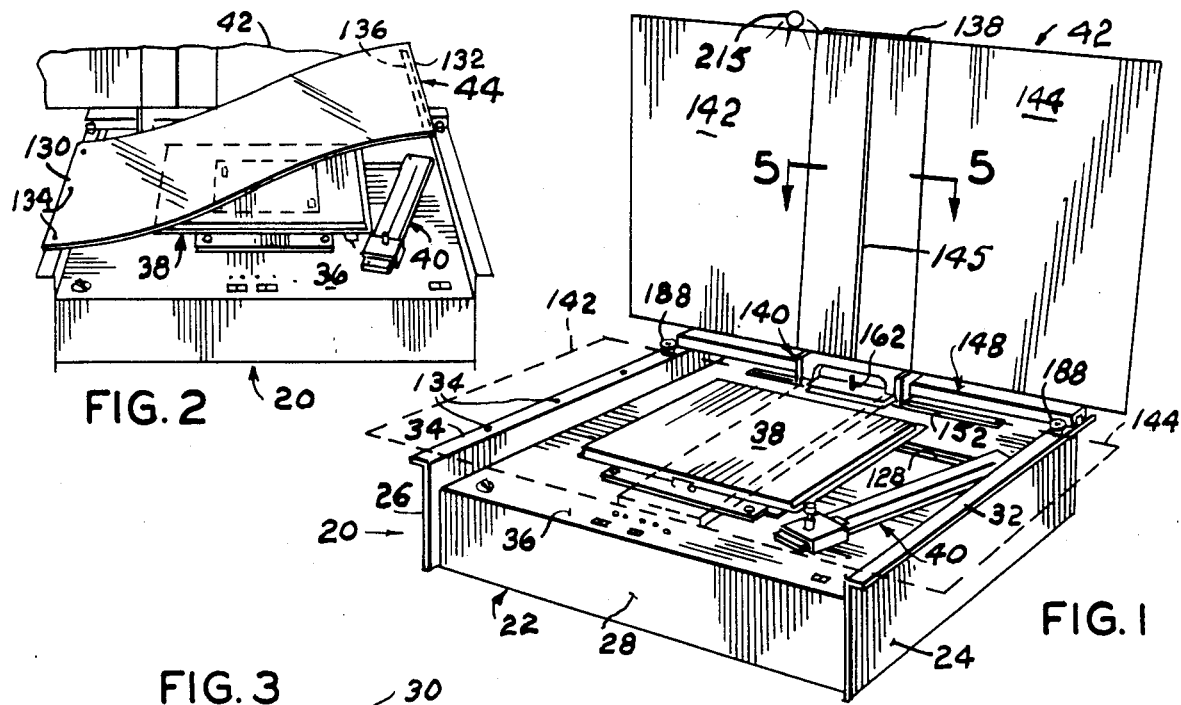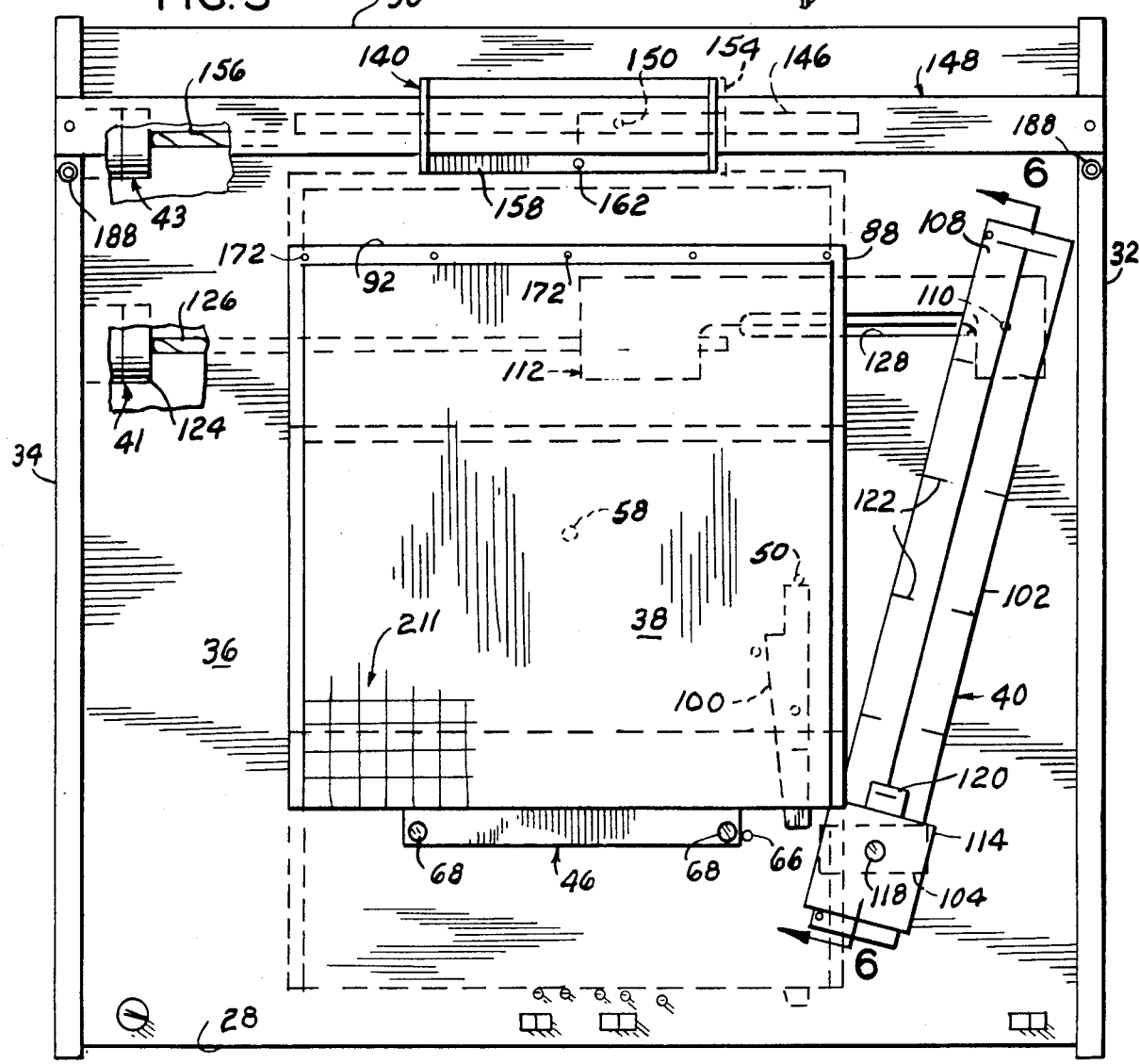

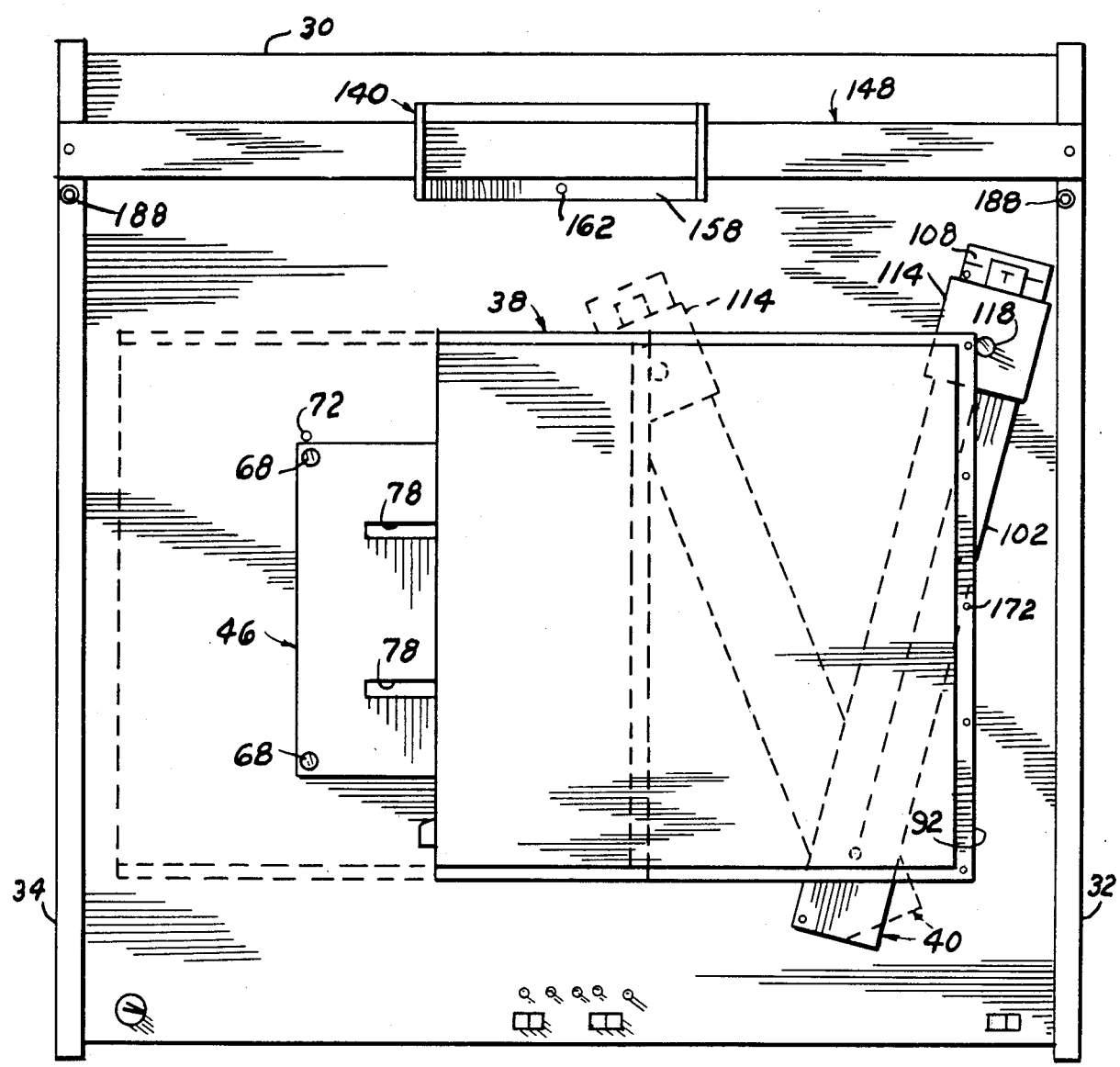
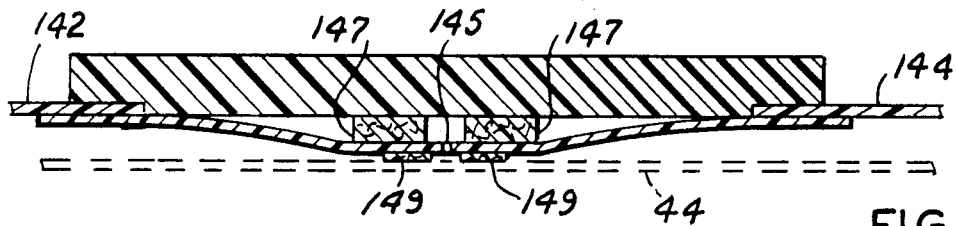
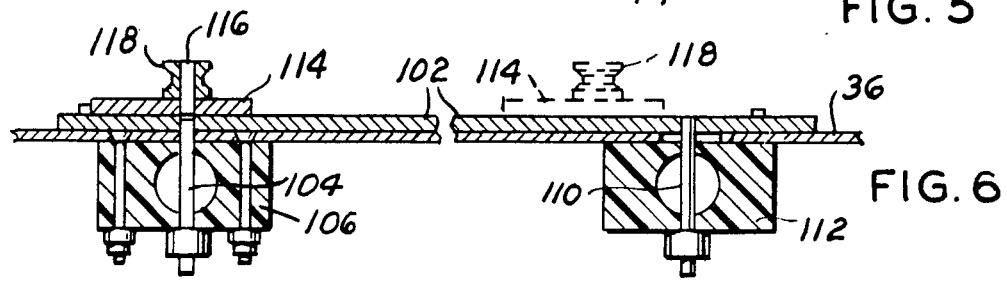
FIG. 4
FIG. 5
FIG. 6

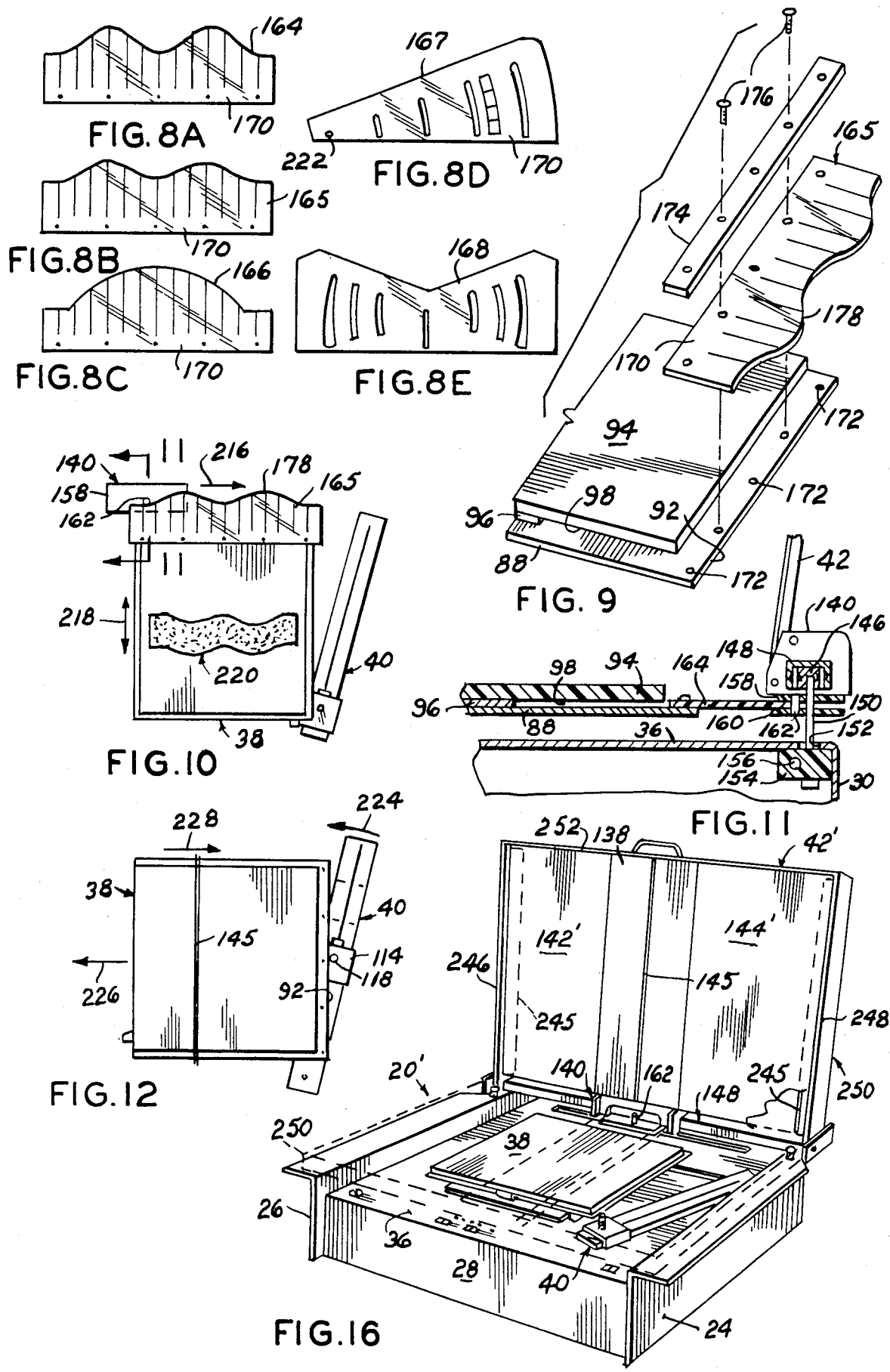

PHOTOGRAPHIC IMAGE PRECISION REPROPORTIONING SYSTEM

CROSS REFERENCE TO RELATED APPLICATION

This application is a continuation-in-part of an application filed my me in the U.S. Patent and Trademark Office on Nov. 29, 1984, Ser. No. 676,336 now U.S. Pat. No. 4,607,952 for PHOTOGRAPHIC IMAGE PRECISION REPROPORTIONING SYSTEM

BACKGROUND OF THE INVENTION

1. Field of the Invention.

The present invention relates to apparatus for changing one or more dimensions or the edge configuration of a two dimension photographic image during photographic exposure of the image on film.

In the reproduction of images contained by photographic film, as by printing, it is frequently desirable to alter or change the dimensions or appearance of an image on photographic paper which is commonly referred to as distortion. In the layout of artwork, as for example, illustrations and/or lettering the precise size of the artwork or lettering image is ordinarily not critical, however, in reproduction of some photo images on photosensitive paper measurements become critical when the images represent printed circuits to be laminated together in forming a final multilayered board. Extending one dimension of photographic print of a printed circuit is necessary for the reason that during lamination the substrate shrinks.

The device of this invention is capable of very precise photo image size adjustments, for example, in increments of one thousandths of one percent.

2. Description of the Prior Art.

Several U.S. patents disclose photographic image distortion apparatus in which one dimension or the configuration of the image is changed with respect to the original image. Most of these prior art patents employ drive apparatus moving one photosheet mounting member relative to another at a different rate of speed and with respect to a source of light by utilizing gears and/or belt and pulley drives. The necessary tolerance between such operating components precludes precise repeatable minute setting measurements necessary in forming images for printed circuit boards.

Other known prior art apparatus is capable of providing incremental resolution equal with the capabilities of the present invention but accomplish this with precisely controlled stepper motors or variable speed drives. The stepper motor drives are relatively expensive and employ complex electronics and for this reason, it is believed, are not in general use. The variable speed drives are also relatively expensive and are not generally capable of precise repeatable results.

U.S. Pat. No. 3,126,809 discloses a photographic distortion apparatus utilizing a horizontal base provided with bar guide channels at opposite sides of the base for respectively moving a film support panel and a film mask having a lamp exposing slit with respect to a second film on the base. A motor driven shaft moves the light exposing slit and links connecting the mask and film panel to a fulcruming lever moves the film relative to the mask.

U.S. Pat. No. 3,445,165 discloses a device changing one dimension of a photographic image a predetermined dimension in one direction of the image. This device includes a stationary film exposing slit and source of light over a fixed frame which encloses a first mounting member moved rectilinear by a pinion and rack with respect to the light source and a second mounting member supporting the photographic image to be printed which is movable relative to and along the same line of rectilinear travel as the first mounting member. A linkage drive system operates to move the separate mounting structures for the image and film relative to the slit. The linkage system utilizes two angularly disposed rods carrying slide blocks. The relative movement between the separate supports are dependent on the angular positions of the rods.

The present invention is distinctive over the prior art apparatus by the simple components utilized which are easily frame mounted in a novel fashion and are relatively inexpensive and requires minimal maintenance. The device is also distinctive over the above named patents by eliminating the members moved transversely to the rectilinear movement of the photographic image and photosensitive sheet mounting members and by moving only one photo image sheet mounting member and by moving the light exposure slit transversely to or in the rectilinear direction of movement of the one image moving member.

SUMMARY OF THE INVENTION

A base frame horizontally supports an overlying dual position platen mounted for rectilinear movement between the forward and rearward and lateral limits of the frame. The purpose of the platen is to support a photosensitive film. The platen is spring biased toward the rear of the frame when in a first position and laterally when in a second position. When in its second position one edge of the platen contacts a slider supported by a pivoting calibration bar which determines the magnitude of platen movement when driven by a synchronous reversible gearmotor. A transparent planar carriage sheet is removably connected with the frame and normally overlies the platen. The purpose of the carriage sheet is to support a photographic film containing an image to be modified. A second synchronous reversible gearmotor, mounted on the frame drives a lead screw progressively moving a longitudinally disposed light aperture bar between lateral limits of the frame in overlying relation with respect to the platen and carriage sheet for progressively exposing superposed contact printing film interposed between the platen and carriage sheet from an overhead light source. A pair of opaque sheets, each connected to respective sides of the light aperture bar overlie and extend beyond respective ends of the carriage sheet in one embodiment and are spring wound on rollers at their opposite end portions at the respective lateral limits of the frame in another embodiment to shield the film from extraneous light prior to, during and following the exposure cycle.

Templates supported by the platen and biased against the aperture bar sliding support modify the configuration of carriage sheet supported images on film attached to the platen. The gearmotor moving the calibration bar against the spring biased movement of the platen and sensitive film thereon relative to an original film mounted on the carriage laterally expands or contracts a film image in accordance with the lateral direction of movement of the aperture bar.

The principal objects of this invention are to provide a photographic image reproportioning apparatus for changing the dimensions or configuration of a photo image in which the magnitude of change may be precisely determined and easily repeated and in which the exactness of change may be on the order of one thousandths of one percent or less.

BRIEF DESCRIPTION OF THE DRAWINGS

FIG. 1 is a perspective view of the apparatus in aperture bar lifted position and illustrating, by dotted lines, the aperture bar in operating position;

FIG. 2 is a fragmentary perspective view, to a smaller scale, illustrating installing or removing a transparent film carriage sheet;

FIG. 3 is a top view, to an enlarged scale, of the device in the position of FIG. 1 with the film carriage sheet and aperture bar removed and portions broken away for clarity;

FIG. 4 is a view similar to FIG. 3 illustrating the platen in another operating position;

FIGS. 5 and 6 are fragmentary horizontal cross sectional views, to larger scales, taken substantially along the lines 5—5 and 6—6 of FIG. 1;

FIGS. 8A through 8E are plan views of film image modifying templates;

FIG. 9 is a fragmentary exploded perspective view, to another scale, of the template to platen mounting means;

FIG. 10 is a diagram illustrating the platen action when using a sine wave template;

FIG. 11 is a vertical cross section view, to a larger scale, taken substantially along the line 11—11 of FIG. 10;

FIG. 12 is a diagram similar to FIG. 10 illustrating the platen action when moved by the calibration bar during percentage modifications;

DESCRIPTION OF THE PREFERRED EMBODIMENTS

Figure 7:
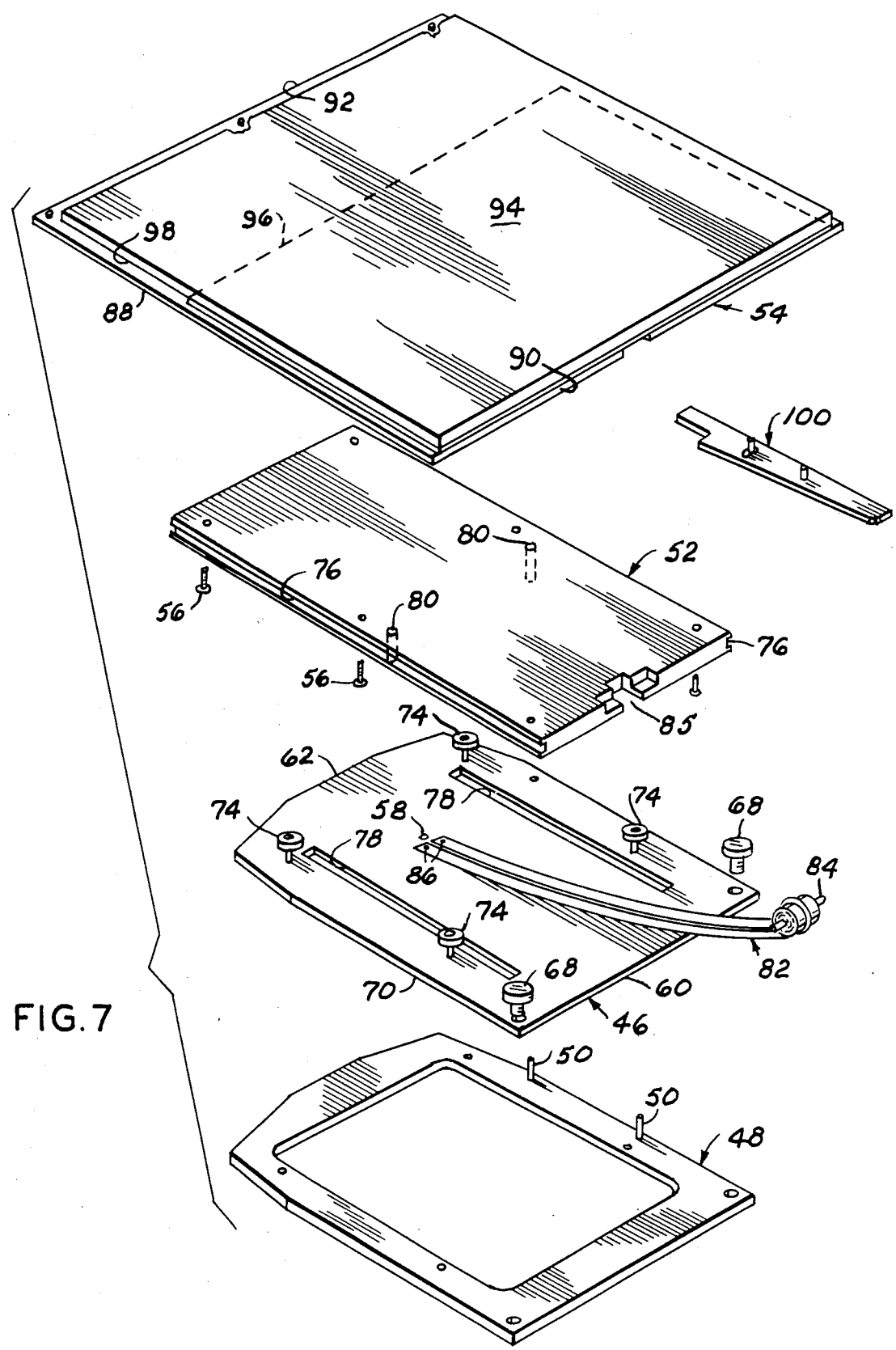
FIG. 7 is an exploded perspective view, to another scale, of the platen components.

Like characters of reference designate like parts in those figures, of the drawings in which they occur.

In the drawings:

The reference numeral 20 indicates the device, as a whole, which is rectilinear flat in general configuration comprising a base frame 22 having parallel sides 24 and 26, a front end 28 and a back or rear end 30. The upper limit of the frame sides 24 and 26 are respectively turned laterally outward to form horizontal flanges 32 and 34, respectively, lying in a common plane for the purpose presently apparent. The frame is further characterized by a horizontal panel or top 36 spaced below the horizontal plane of the flanges 32 and 34 and joined to the respective side and end walls.

A rectangular film supporting platen means 38, of smaller dimension than the frame top 22, horizontally overlies the frame top and is pivotally supported thereon for linear movement between the frame ends and sides. The device 20 further includes a calibration bar means 40 and its drive means 41 for moving the platen means 38 in a lateral direction, an aperture bar or film light exposure means 42 and its drive means 43 and a film carriage sheet 44 to be interposed between the aperture bar means and the platen means.

Platen Means

As shown by FIG. 7 the platen means 38 comprises a generally rectangular flat pivoting support plate 46 substantially centrally overlying the frame top 36 with a substantially equally dimensioned open frame-like spacer 48 underlying the support plate 46 and secured thereto as by pins 50 extended through cooperating bores. A platen guide plate 52 horizontally overlies and is slidably supported by the support plate 46 as presently explained. A three layered platen 54 is generally centrally superposed on the platen guide plate and secured thereto by screws 56.

The support plate 46 is flatly secured to the frame top 36 by a pivot pin 58 with the plate forward and rearward edges 60 and 62, respectively, normally parallel with the respective forward and rearward frame edges 28 and 30. In this position the right side edge 64, as viewed in FIGS. 3 and 4, of the support plate 46 abuts a stop pin 66 (FIG. 3). The support plate 46 is normally secured against pivoting in this position to the frame top 36 by anchor screws 68. The platen means 38 is horizontally rotatable as a unit about the axis of the pin 58 from the position of FIG. 3 to its position shown by FIG. 4 by manually removing the screws 68 and rotating the platen means 90° clockwise until its opposite side edge 70 contacts a second stop pin 72 (FIG. 4) and is similarly secured to the top by the screws 68 for the purpose presently explained.

A plurality, four in the example shown, of roller bearings 74 are mounted by pairs on the support plate 46 adjacent respective side edges of the guide plate. The bearings are each mounted on a shaft projecting above the support plate top surface for the purpose of disposing a portion of the periphery of each bearing in contact with a longitudinal groove 76 formed in the respective side edge surface of the platen guide plate 52. This manner of mounting eliminates any transverse movement of the platen 54 during film exposure as presently explained.

A pair of elongated longitudinally extending slots 78 are formed in the support plate 46 with each slot spaced inwardly from the respective pair of bearings 74 and normal to the frame front and rear end walls, which permits forward and rearward rectilinear movement of the platen 54 relative to the frame top when in the position of FIG. 3 for the reasons and as more fully explained hereinbelow. A pair of guide pins 80 depend from the platen guide plate with their depending end portions respectively disposed in the respective slot 78 for limiting movement of the platen 54 toward the support plate ends 60 and 62. The platen 54 is constantly biased toward the forward end 62 of the support plate 46 by a spring means 82 wound on an axle 84 journalled by a recess 85 in the forward edge of the guide plate 52.

The free end of the spring means means 82 is secured to the top surface of the support plate 46 adjacent the pivot pin 58 as at 86.

The platen 54 comprises a substantially square platen base plate 88 having a forward edge 90 and a rearward edge 92. A transparent platen plate 94 of predetermined smaller dimensions and having a film locating grid scored or printed on its depending surface overlies the platen base 88 with a platen spacer 96 interposed therebetween toward the forward edge 90 of the base to define a gap or slot 98 opening rearwardly between the rearwardly disposed edges of the platen base and platen transparent top, for the purpose presently explained. The top surface of the platen 54 lies in a horizontal plane slightly above the horizontal plane defined by the top surfaces of the flanges 32 and 34 for the purpose believed presently apparent.

A latch bar 100 pivotally supported horizontally by the depending surface of the platen base 88 is manually releasably engageable at one end portion with the pins 50 by its forwardly projecting end portion to latch the platen 54 in an intermediate or forward position.

Calibration Bar Means

The calibration bar means 40 includes an elongated lever 102 which is pivotally mounted at one end portion on the frame top 36 by a dowel pin 104 (FIG. 6) projecting vertically through a pillow block 106 rigidly mounted on the undersurface of the frame top 36 adjacent but spaced laterally, to the right as viewed in FIG. 4, from the vertical plane of the right side edge of the platen means 38 and adjacent its forward edge 90. The longitudinal length of the calibration lever 102 is greater than the front to back dimension of the platen means and its end portion 108 opposite the dowel pin 104 is secured by a second dowel 110 to one leg of an elongated bight portion U-shaped calibration lever drive block 112 forming a part of the calibration bar drive means 41 as presently explained.

The calibration bar means 40 further includes a slider 114 extending transversely of the lever 102 intermediate its ends and is slidable therealong. The slider supports a short upstanding dowel 116 (FIG. 6) having a spool bearing 118 thereon for the reasons presently explained. The slider includes a transparent shield 120 having a scribe thereon for coinciding alignment with any one of a plurality of indicia lines 122 extending transversely of the lever 102 medially its width. The lines 122 form a scale extending between the respective end portions of the lever and divide the distance between the pivot dowel 104 (zero position) and the other maximum extended position of the slider 114, as viewed in FIGS. 3 and 4, into equal increments, for example one thousand divisions. If the maximum position is one percent, each increment would represent one thousandth of one percent. Each one hundred increments would equal one tenth of one percent, etc.

Scale measurements to be obtained must be on the order of one thousandths of an inch or millimeters for printed circuit components and a percentage or fractions of a percent for use in flexographic printing where a rubber printing plate is wrapped around a cylinder.

The respective longitudinal sides of the lever 102 converge downwardly and the respective side portions of the slider 114 have downwardly converging inner edge surfaces slidably contacting the respective sides of the lever in a dovetail type configuration to prevent lateral movement of the slider relative to the lever.

The calibration bar drive means 41 comprises a reversible synchronous gearmotor 124 mounted on the undersurface of the frame top 36 adjacent the frame side 26. The gearmotor drives an actuator screw shaft 126 laterally longitudinally underlying the frame top 36 and threadedly engaged, in zero end play fashion, with the other leg of the U-shaped block 112. Energizing the gearmotor 124 in respective directions moves the calibration bar end portion, opposite its fulcrum point dowel 104, toward and away from the platen means 38. An elongated transverse slot 128 in the frame top 36 loosely surrounds the calibration bar drive dowel 110 to permit this action.

Carriage Sheet Means

The carriage sheet means 44, preferably formed from semirigid plastic sheet material, has a width greater than the length of the platen means 38 but less than the length of the frame 22 and a length substantially coextensive with the transverse width of the frame 22 so that its respective end portions 130 and 132 overlie the frame flanges 32 and 34. The carriage sheet end portion 130 is provided with a plurality of apertures which cooperatively receive a like plurality of upstanding register pins on the frame flange 34. The other end portion 132 of the carriage sheet is temporarily attached to the flange 32 by a strip of double sided adhesive tape 136 each time the device 20 is operated.

Aperture Bar Means

The aperture bar means 42 comprises a rigid elongated rectangular transparent bar 138 coextensive with the length of the frame top 36 hingedly mounted on a bracket 140 for vertical movement of the bar toward and away from the horizontal plane of the platen means 38. A pair of semirigid opaque masking sheets 142 and 144 are respectively connected with opposing longitudinal side edges of the bar 138 and project beyond the lateral limits of the frame and are moved with the bar by the bracket transversely of the frame 22 by the gearmotor means 43. An opaque mask sheet 143, with a length and width dimensioned at least equal to the bar 138, includes a longitudinal central transparent opening or slit 145 underlying the bar 138 medially its width. A pair of spacer pads 147 coextensive with the bar 138 are interposed in laterally spaced relation between the bar and the intermediate mask 143 on respective sides of the clear slit 145 for the purpose of spacing the aperture bar above the upper limit of the carriage sheet 44 during film exposure, as presently explained, to insure close contact of the intermediate mask and its clear slit 145 with the carriage sheet and film supported thereby. Additionally, a second pair of elongated relatively thin pads 149 are secured to the intermediate mask 143 on opposing sides of the clear slit 145 as a cushion between the mask 143 and carriage sheet 44.

The bracket 140 is slidably supported by the bearing supported central moving member 146 (FIG. 11) of a conventional channel bar drawer glide 148. The glide 148 extends transversely of the frame adjacent its rearward wall 30 and overlies and is secured at its respective ends to the frame flanges 32 and 34.

A shaft 150 depends vertically from the bar member 146 and is loosely received by an elongated slot 152 in the frame top underlying the drawer glide 148. An actuator block 154 is secured to the depending end portion of the shaft 150 below the frame top 36. The drive shaft 156 of the gearmotor 43 threadedly engages the block 154 to move the aperture bar assembly in a selected direction.

The aperture bar assembly further includes upper and lower template guides 158 and 160 superposed in spaced relation below the bracket 140. An upstanding guide pin 162 extends through and above the template guides 158 and 160 in parallel alignment with the light slot or aperture 145 for the purposes presently explained.

A plurality of templates 164, 165, 166, 167 and 168 are provided as examples of templates to be used in making film images, modifications or reproportions. The base edge 170 of each template is provided with apertures cooperatively receiving register pins 172 on the edge portion of the platen base adjacent the rearward edge 92 of the platen base 88, as illustrated by FIG. 9. A template clamp bar 174 overlies the template base edge 170 of the template 165 and is secured thereto by screws 176. The sine wave edge portion 178 of the template enters the spacing between the platen guides 158 and 160 (FIG. 11) and is biased against the guide pin 162 during movement of the aperture bar assembly 42, as presently explained.

Circular Modification

The device 20 can be utilized to modify the film of a word, to describe a partial or complete circle. To accomplish this and referring more particularly to FIGS. 13 and 14, an elongated carriage bar 180, having a length substantially greater than the transverse width of the frame 22 and a width less than the width of the platen means 54 transversely overlies the frame 22 for moving with the aperture bar means 42. To accomplish this, the medial portion of the carriage bar 180 has one longitudinal edge 182 provided with a lateral extension 184 medially its ends and a transverse slot 186 terminating in the longitudinal plane of the longitudinal edge 182. The purpose of the slot 186 is to receive the center guide pin 162 of the aperture bar means when the carriage bar 180 transversely overlies the frame flanges adjacent the aperture bar means. A pair of carriage guide bearings 188 are respectively mounted on the frame flanges 32 and 34 adjacent the drawer glide 148 and in parallel alignment therewith for contact with the carriage bar edge 182 at its respective end portions when moved transversely of the frame 22, as presently explained.

A disc pivot plate 190 of substantially equal dimensions with respect to the platen 54 is provided with a down turned flange 192 along one edge for cooperatively overlying the platen 54 with the flange disposed in contact with the upper surface of the platen bar adjacent its forward edge 92 for locating the disc pivot plate relative to the platen. The opposite edge of the disc pivot plate is provided with an overlying bar having laterally spaced upstanding pins 194 thereon for the purpose presently explained.

The top surface of the carriage bar 180 and the top surface of the disc pivot plate 190 lie in substantially a common horizontal plane. The disc pivot plate is centrally provided with an upstanding pivot pin 196 for journalling a centrally apertured disc 198 having a diameter less than the diameter of the disc pivot plate 190 which it flatly overlies. The peripheral edge of the disc 198 overlies the adjacent rearwardly disposed edge portion 200 of the carriage bar 180. The disc 198 is provided with an underlying drive disc 202 of smaller diameter with a portion of its peripheral edge in contact with the rearward edge 204 of the carriage bar as the latter is moved transversely of the frame by the aperture bar assembly and the forward spring bias of the platen means 38. An aperture plate 206, of substantially equal dimensions with respect to the plate 54 and having a film exposure aperture slot 207, overlies the disc pivot plate and includes cooperative apertures adjacent its rearward edge 208 which receive the disc pivot plate pins 194 to maintain the aperture plate 206 stationary with respect to the platen means. The forward edge portion of the aperture plate 206 overlies an elongated spacer bar 210 longitudinally overlying the carriage bar 180 intermediate its width.

Referring to FIG. 16, the numeral 20' indicates an alternative embodiment of the device which is substantially identical to the device 20 with the exception of the aperture bar means 42'. The aperture bar means 42' includes the aperture bar 138 pivotally supported by the bracket 140 and moved along the drawer slide 148 in an identical manner. The opaque mask or sheets 142' and 144' are flexible sheets mounted on spring urged rollers 245, such as described in the above referred to copending application, serial No. 676,336, with the rollers journalled at respective sides of the frame, overlying the frame flanges 32' and 34', on the legs 246 and 248 of a U-shaped yoke 250. The bight portion 252 of the yoke overlies the forward edge portion of the frame when in film modifying position, as shown by dotted lines. The end of the respective yoke leg, opposite the bight portion, is pivotally connected with the frame adjacent its rearward limit for vertical pivoting movement of the yoke/aperture bar as an assembly 42' toward and away from the frame top surface 36. During transverse frame movement of the aperture bar 138, the opaque sheets 142' and 144' are wound up or payed out in accordance with the direction of movement of the aperture bar.

OPERATION

The platen is provided with a plurality of equally spaced crossed lines forming a grid pattern, a fragment of which is shown in FIG. 3 at 211. The purpose of the grid pattern is to guide the location of film placed on the platen 54.

The principles of operation of the device include the following: Template modification of a film image; expansion and contraction of one film image dimension; and, producing a circle configuration of a film image.

For template film image modification, the platen means 38 is disposed in its position of FIG. 3 for spring bias back to front movement and latched by the latch bar 100 in its solid line position of FIG. 3. The film original, not shown, containing the image to be modified, is centrally positioned on the platen 54. A short section of double sided tape is applied to the original film on the top side of its four corner portions. The carriage sheet 44, attached to its locator pins 134, is slowly lowered onto the platen being careful to not move the original film. Manual pressure is applied to the top surface of the carriage sheet over the position of the double sided tape on the original film so that this film adheres to the underside of the carriage sheet which is lifted to an out-of-the-way position. A section of unexposed film is identically positioned on the platen and is taped thereto. The platen is then latched in its fully rearward position and a selected one of the templates, for example the template 165, is attached to the platen base forward edge portion, as explained hereinabove.

The platen means latch 100 is released and the platen manually positioned forwardly under the bias of its spring so that the template edge 178 is in contact with the aperture bar center pin 162. With the carriage sheet 44 register pin and tape secured in place over the platen, the aperture bar means 42 is lowered to its dotted line position of FIG. 1. The appropriate one of the electric controls is then manually actuated which simultaneously energizes an overhead film exposure lamp 215 and energizes the motor means 43 which moves the aperture bar assembly 42 in the direction of the arrow 216 (FIG. 10) while simultaneously the sine wave template edge 178 following the center pin 162, moves the platen means 38 forwardly and rearwardly as shown by the arrow 218 as the aperture bar slot 145 moves transversely to the right, as viewed in the drawing, exposing the ori9inal film image on the platen as indicated by the shaded area 220.

The templates 167 and 168 (FIGS. 8D and 8E) are similarly utilized for italicizing film images of letters in which the template 167 may be pivoted about a pivot point 222 on one of the platen base pins 172 wherein the rearward edge of the template is slidably received in the platen forward slot 98. Similarly, the template 168 may be manually pivoted centrally about one of the pins 172 for obtaining a desired angle by its beveled forward edges.

Obviously, templates of other configurations may similarly be employed for modifying film images.

In contracting or expansion of a film image, the platen means 38 is rotated about its central axis 58 to its position of FIG. 4, for left and right movement. The amount or percentage of reduction or expansion being predetermined in percentages and the calibration bar slider 114 is accordingly disposed intermediate the ends of the calibration bar. The platen means base edge 92 is disposed in contact with the calibration bar spool bearing 118. For film image contraction, the films are located and secured, as described hereinabove. The appropriate one of the electrical controls is energized and the calibration bar pivots in the direction of the arrow 224 (FIG. 12) and moves the platen means 38 in the direction of the arrow 226 while the aperture bar slit 145 moves in the opposite direction as indicated by the arrow 228 thus forming a shorter or condensed image of an original film image.

For expansion or lengthening of a film image, the identical procedure is followed with the exception that the aperture bar 42 is disposed toward the right side 24 of the frame before energizing the device and exposure lamp so that the calibration bar and platen means respectively similarly move in the direction of the arrows 224 and 226 while the aperture bar slit 145 moves in the same direction, opposite the direction of the arrow 228.

Figure 13:
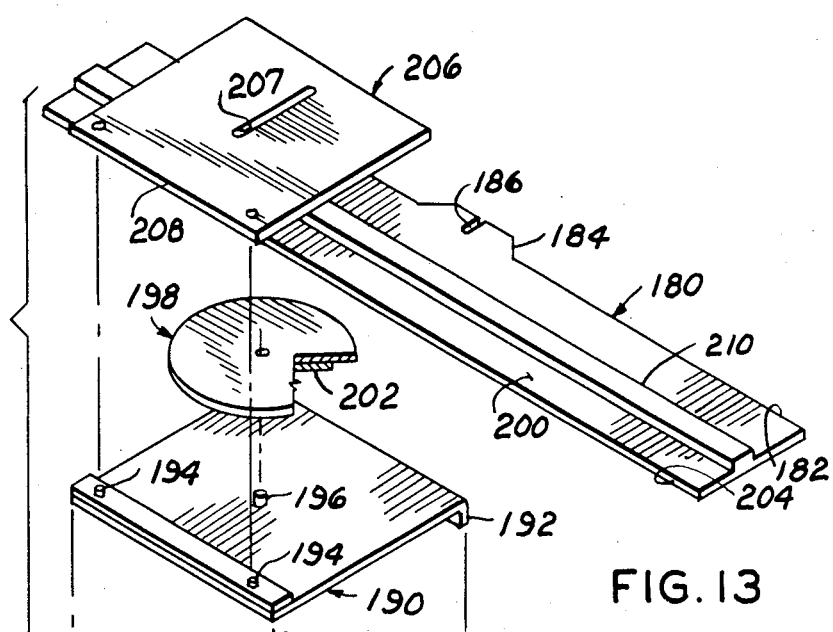
FIG. 13 is an exploded perspective view, to a different scale, illustrating film image circle forming attachments.
Figure 14:
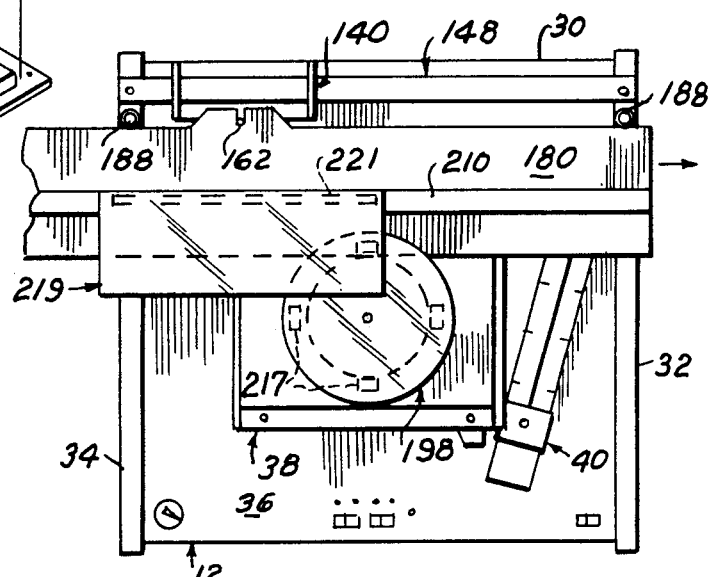
FIG. 14 is a top plan view of the device with the components of FIG. 13 in place.

For circular modification of the film image, the platen means 38 is initially disposed in its intermediate front to back template operating position and the aperture bar means 42 is raised and remains in its upright solid line position of FIG. 1. The circle forming components of FIG. 13 are installed on the frame and platen as described hereinabove. A sheet of unexposed film is placed on the disc 198 being held in place by four small sections of double sided tape 217 and the excess film trimmed away from the perimeter of the disc. An elongated section of original film 219, containing the image to be copied, not shown, is secured by one longitudinal edge of the material by double sided tape 221 interposed between the film edge and the carriage bar spacer 210 with the transverse center of the film 219 aligned with the carriage bar drive pin 162. The aperture plate 206 is then positioned over the film 219 and disc 198 and the aperture bar motor means 43 energized to drive the aperture bar assembly 42 moving the carriage bar 180 toward the frame side 24. The carriage bar forward edge 204 angularly rotates the disc 198 by frictional contact with the periphery of the drive disc 202.

Figure 15A:
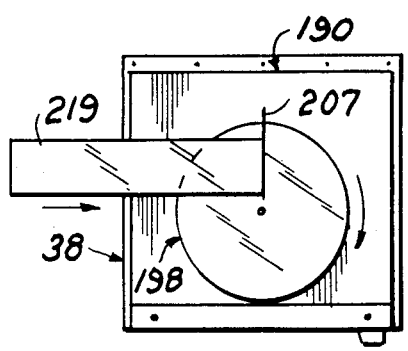
FIGS. 15A through 15C are diagrams illustrating the circular modification of a film image; and, FIG. 16 is a perspective view, similar to FIG. 1, of another embodiment.
Figure 15B:
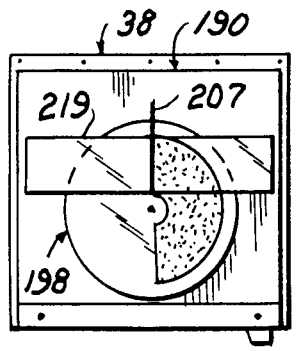
Figure 15C:
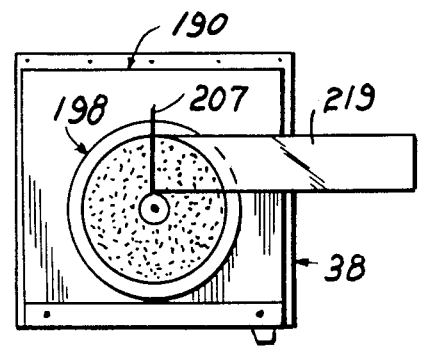

FIGS. 15A–15C diagrammatically illustrate the transferring of the figure image to the film on the disc 198 by the spatter dot shading. Obviously, the dimensions of the original film and image thereon to be copied must be cooperatively proportioned with the diameter of the disc.

Obviously the invention is susceptible to changes or alterations without defeating its practicability. Therefore, I do not wish to be confined to the preferred embodiment shown in the drawings and described herein.

I claim:

1. A photographic image reproportioning apparatus, comprising:
    a base having opposing ends, opposing sides and a planar top;
    transparent carriage means overlying said top for supporting a photographic film having an image thereon;
    platen means interposed between said top and said carriage means for supporting a photosensitive sheet in printing contact with the photographic film;
    means mounting said platen means on said top for rectilinear movement between the base ends when in a first position and between the base sides in a second position and normally biasing said platen means in one direction;
    manually adjustable calibration bar means contacting and moving said platen means a predetermined distance opposite said one direction when in said second position;
    light impervious mask means including an opaque sheet overlying said carriage means and having a photo-light passing slit extending transversely or in the direction of platen means travel for the passing of film exposure light therethrough;
    motor driven means for simultaneously or separately moving said mask means and said calibration bar means in the same or opposite directions along the platen means travel path; and,
    template means interposed between the platen means and the motor driven means for predetermined movement of the platen means against or with its bias in said one direction when in said first position.

2. The apparatus according to claim 1 in which the motor driven means includes:
    a plurality of reversible synchronous motors respectively operatively connected with said mask means and said calibration bar means.

3. The apparatus according to claim 2 in which said calibration bar means includes:
    a lever pivotally connected at one end portion with said top and extending generally transversely of one direction of travel of said platen means for horizontal pivoting movement of its other end portion toward and away from said platen means; and,
    a slider slidable longitudinally of said lever,
        whereby the position of said slider relative to the ends of said lever determines the magnitude of movement of said platen means.

4. The apparatus according to claim 3 in which said mounting means includes:
    support plate means interposed between said top and said platen means;
    guide bearing means contacting platen means opposing edge surfaces parallel with the direction of platen means movement; and,
    resilient means bearing against an edge surface of said platen means.

5. The apparatus according to claim 1 in which said platen means includes a platen base plate and said mounting means includes:
   a guide plate interposed between said base plate and said top;
   a plurality of guide bearings contacting opposing edge surfaces of said guide plate parallel with its direction of movement; and,
   resilient means bearing against an edge surface of said guide plate.

6. The apparatus according to claim 5 in which said calibration bar means includes:
   a lever pivotally connected at one end portion with said top adjacent said base plate and extending transversely of one direction of base plate travel for horizontal pivoting movement of its other end portion toward and away from said base plate;
   a slider slidable longitudinally of said lever; and,
   a scale on said lever,
      whereby the position of said slider on said scale determines the magnitude of movement of said base plate.

7. The apparatus according to claim 6 in which said mask means includes:
   elongated flexible opaque sheets extending longitudinally across said carriage means in the direction or transverse to the direction of platen means movement;
   a yoke pivotally supported by said frame; and,
   roller means on said yoke for winding up and paying out respective end portions of said opaque sheets in response to movement of the mask slit transversely of the frame.

8. The apparatus according to claim 7 in which said motor driven means includes:
   a pair of motors respectively mounted on said base laterally of one path of movement of said platen means;
   a pair of screw drive shafts respectively angularly rotated by said pair of motors; and,
   means connecting said drive screw shafts with said mask means.

9. A photographic image reproportioning apparatus, comprising:
   a frame having opposing ends, opposing sides and a top surface;
   a transparent carriage means overlying said top surface for supporting a photographic film having an image thereon;
   platen means interposed between said top surface and said carriage means for supporting a photosensitive film in printing contact with the photographic film;
   bearing means supporting and guiding said platen means for to and fro rectilinear movement longitudinally or transversely of the frame;
   resilient means normally biasing said platen means in one direction;
   template means for moving the platen means against or with its bias longitudinally of the frame;
   manually adjustable calibration bar means contacting and moving said platen means against said resilient means, when moving transversely of the frame, for controlling the magnitude of movement of the platen means;
   light impervious mask means overlying said carriage means and having a photo-light passing slit extending across said platen means during its travel for the passing of film exposure light therethrough;
   a first motor drivably connected with said calibration bar means for movement thereof toward or away from the platen means; and,
   a second motor drivably connected with said mask means for moving the mask slit in the same or opposite direction of calibration bar means movement.

10. The apparatus according to claim 9 in which said platen means includes a flat plate and said bearing means includes:
    support plates including a guide plate interposed between said plate and said top; and,
    guide bearings contacting opposite side surfaces of said guide plate parallel with the direction of guide plate travel.

11. The apparatus according to claim 10 in which said calibration bar means includes:
    a lever pivotally connected at one end portion with said top and extending generally transversely of the direction of travel of said platen means when in one position for horizontal pivoting movement of its other end portion toward and away from said platen means;
    a slider longitudinally slidably supported by said lever in contact with said platen means when the later is in said one position; and,
    an elongated scale on said lever,
       whereby the position of said slider on said scale determines the magnitude of movement of said platen means.

12. The apparatus according to claim 11 in which said mask means includes:
    elongated semirigid opaque sheet means longitudinally overlying and moveable relative to said carriage means; and,
    aperture bar means including a transparent rigid bar vertically pivotal toward and and away from said top and extending longitudinally of said frame medially the length of said opaque sheet means for guiding the latter relative to said carriage means.

* * * * *